United States Patent
Patterson et al.

(10) Patent No.: US 7,343,578 B1
(45) Date of Patent: Mar. 11, 2008

(54) METHOD AND SYSTEM FOR GENERATING A BITSTREAM VIEW OF A DESIGN

(75) Inventors: Cameron D. Patterson, Blacksburg, VA (US); Prasanna Sundararajan, Mountain View, CA (US); Brandon J. Blodget, Santa Clara, CA (US); Scott P. McMillan, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 429 days.

(21) Appl. No.: 10/917,064

(22) Filed: Aug. 12, 2004

(51) Int. Cl.
*G06F 17/50* (2006.01)
(52) U.S. Cl. .............................. 716/16; 716/17; 716/18
(58) Field of Classification Search .................. 716/16, 716/17, 18
See application file for complete search history.

(56) References Cited

U.S. PATENT DOCUMENTS

| | | | |
|---|---|---|---|
| 5,649,176 A * | 7/1997 | Selvidge et al. ............ | 713/400 |
| 5,764,076 A * | 6/1998 | Lee et al. ...................... | 326/38 |
| 5,802,290 A * | 9/1998 | Casselman ................... | 709/201 |
| 5,946,219 A * | 8/1999 | Mason et al. ................. | 716/16 |
| 6,205,574 B1 | 3/2001 | Dellinger et al. | |
| 6,525,557 B1 | 2/2003 | McManus et al. | |
| 6,678,646 B1 * | 1/2004 | McConnell et al. .......... | 703/22 |
| 6,711,674 B1 | 3/2004 | Burnham | |
| 6,747,478 B2 * | 6/2004 | Madurawe .................... | 326/39 |
| 6,990,508 B1 * | 1/2006 | Mohammed et al. ........ | 708/700 |
| 7,249,010 B1 | 7/2007 | Sundararajan et al. | |
| 2002/0150252 A1 * | 10/2002 | Wong .......................... | 380/277 |

OTHER PUBLICATIONS

U.S. Appl. No. 10/917,033, filed Aug. 12, 2004, Patterson et al.
U.S. Appl. No.: 10/917,042, filed Aug. 12, 2004, Schumacher, Paul R. et al., "Concealed, Non-Intrusive Watermarks for Configuration Bitstreams", 33 pages, available from Xilinx, Inc., 2100 Logic Drive, San Jose, CA 95124.
Jain, Adarsh K., et al.; "Zero Overhead Watermarking Technique for FPGA Designs"; Copyright 2003; GLSVLSI 2003; Apr. 28-29, 2003; pp. 1-6.
Xilinx Application Note: Virtex Series; XAPP151 (v1.5), "Virtex Series Configuration Architecture User Guide" Sep. 27, 2000; pp. 1-45; available from Xilinx, Inc. 2100 Logic Drive, San Jose, California 95124.
Xilinx Application Note: XAPP153 (v1.0), "Status and Control Semaphore Registers Using Partial Reconfiguration"; Jun. 7, 1999; pp. 1-4; available from Xilinx, Inc. 2100. Logic Drive, San Jose, California 95124.
Xilinx Application Note: Virtex II Pro Family; XAPP662 (v2.4), "In-Circuit Partial Reconfiguration of RocketIO Attributes" May 26, 2004; pp. 1-29; available from Xilinx, Inc. 2100 Logic Drive, San Jose, California 95124.

* cited by examiner

*Primary Examiner*—Sun James Lin
(74) *Attorney, Agent, or Firm*—Samuel G. Campbell (57) ABSTRACT

A method and system for generating a bitstream view of a programmable logic device (PLD) design are disclosed. The present invention allows for the correlation of a physical circuit description (e.g., one or more of a PLD design's essential configuration bits) and a logical circuit description (e.g., one or more of the logic elements that make up a PLD design), which can also be viewed as correlating one or more of the physical elements of the design's implementation in the PLD with one or more of the design's logical elements.

39 Claims, 8 Drawing Sheets

METHOD AND SYSTEM FOR GENERATING A BITSTREAM VIEW OF A DESIGN

BACKGROUND OF THE INVENTION

1. Field of the Invention

This invention relates to the field of programmable logic devices, and more particularly relates to a method and system for identifying the essential configuration bits of a design.

2. Description of the Related Art

In creating a design that is to be programmed into a programmable logic device (PLD), a designer employs a program tasked with generating the configuration bits representing the design (referred to as a configuration bitstream generation module, or the like), among other such design tools. A configuration bitstream generation module determines the value of each configuration bit used in the design, based on a description of the circuit being implemented. Such a circuit description typically includes logic elements, logical connections and other such information.

Typically, the set of configuration bits used by a given design is only a subset of the total number of configuration bits in the programmable logic device being programmed. These "essential" or "care" configuration bits configure the resources used in implementing the logic elements that make up the given design (such as look-up tables (LUTs), multiplexers, programmable interconnect points (PIPs) and the like) by defining the function(s) implemented by those resources. Some of these essential configuration bits (or more simply, essential bits) may be set (e.g., to a logic one), while others are allowed to retain their default configuration value (e.g., a logic zero). While the value of the latter are the same as unused configuration bits, such essential bits are nonetheless necessary to implement the given design. As will be appreciated, essential configuration bits that retain their default value are therefore difficult to distinguish from unused configuration bits.

Often, however, a project will require the identification or count of the design's essential bits, and so present a fairly intractable problem. As just noted, this cannot be determined simply by comparing the bitstream generated with a blank bitstream because their difference will not evidence all the design's essential configuration bits, but only those configuration bits with altered values (which, as will be appreciated, are relatively straightforward to discern). Moreover, determining which configuration bits are used in a given design also requires the solution to another problem, namely the functional grouping of configuration bits.

Heretofore, a combination of various tools and manual operations have been used to provide such identification. However, these approached have suffered from a variety of infirmities. For example, such a tool chain may be able identify a large portion of the essential bits of a design, but with limited accuracy, or may be able to identify only a small subset of the essential bits, albeit with acceptable accuracy. Moreover, such approaches can require significant resources (e.g., requiring the grouping of configuration bits be performed manually, when attempting to coordinate configuration bits and logic elements).

One approach identifies essential bits using a process that begins with the creation of a circuit description database by the design environment's implementation tools. Such a database represents the physical view of a programmable logic device's design (e.g., an FPGA design). The design's circuit description database is input to a program that identifies the routing resources used, and then a tool that identifies the logic resources used (referred to as a logic resource identifier).

The output of the logic resource identifier is input to a script that accesses a database generated from the configuration data model. The output of this script and the routing resources file are read by a design extractor. The design extractor maps the wire resources to the respective configuration bits by using a wire database. The location of wire and logic bits within the bitstream is also determined for the target device.

Practical issues arise when using a tool chain such as that described above. One limitation is that an assortment of environments and tools are required: stand-alone programs, scripts, database engines and other design environment tools. Support for these tools may need to be distributed across several divisions/groups within an organization. Moreover, file sizes, memory requirements and execution times can be considerable for large designs when using such an approach.

In many cases, such a tool chain is also limited in the number of architectures that can be supported. This is due, in part, to the fact that developing and validating a model for a new architecture using such an approach is a great deal of work. Although scripts can be used to automatically generate some of the requisite information from device model files, substantial manual work is still required for logic resources. Such tools are required to have complete tile and configuration bit coverage, which is not normally required in other uses of such tools. Such coverage can also be difficult to achieve and verify. The effort involved is compounded by the large number of tile types in some architectures.

Configuration bits can also be affected by run-time options used by the configuration bitstream generator, as well as the structure of the configuration bitstream generator's internal code. Moreover, configuration bits are often not captured in the circuit descriptions used to describe the circuit being implemented. Although most of these options affect the startup process, they are sometimes used for other purposes, and so their effects may go unnoticed or undetected.

What is therefore desired is an approach that addresses the foregoing infirmities, and in so doing, provides a bitstream view of a programmable logic device design. Preferably, such an method and system should provide such capabilities as part of a standard design flow.

SUMMARY

Embodiments of the present invention addresses the foregoing limitations by providing a method and system capable of generating a bitstream view of a programmable logic device (PLD) design. Embodiments of the present invention provides the ability to maintain information regarding the relationship between essential bits and logic elements. This information provides for the generation of a bitstream view when using a design environment of the present invention.

Techniques according to the present invention correlate a physical circuit description (e.g., one or more of a PLD design's essential configuration bits) and a logical circuit description (e.g., one or more of the logic elements that make up a PLD design), which can also be viewed as correlating one or more of the physical elements of the design's implementation in the PLD with one or more of the design's logical elements. This correlation is based on the inventors, observation that, if configuration bits have similar configuration bit definitions (e.g., similar terms in their configuration bit description (CBD) equations), those configuration bits control the same instance of a resource of a programmable logic device (or more simply, a resource). Resources include, but are not limited to: routing resources, logic resources, memory resources, informational resources and the like. The use of the term "similar" depends upon the type of resource, as described herein.

In one embodiment, a method and system are disclosed. The method includes correlating a physical circuit description and a logical circuit description. The correlating uses a configuration bit definition.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and numerous objects, features, and advantages made apparent to those skilled in the art by referencing the accompanying drawings.

The use of the same reference symbols in different drawings indicates similar or identical items.

DETAILED DESCRIPTION OF THE INVENTION

The following is intended to provide a detailed description of an example of the invention and should not be taken to be limiting of the invention itself. Rather, any number of variations may fall within the scope of the invention which is defined in the claims following the description.

Introduction

Embodiments of the present invention provides a method and system capable of generating a bitstream view of a programmable logic device (PLD) design. A design environment according to an embodiment of the present invention provides different views of a design, such as logical/physical, hierarchical/flat, and timing, and also provides a bitstream view.

The present invention can be implemented, for example, in a design environment's configuration bitstream generator. Using a tool thus modified, it is possible to support querying of information relating configuration bits to user-named design element instances (or more generically, logic elements). Thus, the correspondence between configuration bits and logic elements is made available for examination by the designer. This "bitstream view" of a design provides much of the information needed to update a bitstream directly, thereby providing an automatic and architecture-generic solution for designers.

Embodiments of the present invention provides a number of other advantages. The ability to maintain information regarding the relationship between essential bits and logic elements is an important advantage of the present invention. This information provides for the bitstream view provided by a design environment of the present invention.

In this regard, an important aspect of embodiments of the present invention is its ability to provide the information required to update the bitstream directly in run-time reconfiguration environments. This is made possible by the visibility into the bitstream (and corresponding logic elements) that is provided by a design environment of the present invention. Such information, as could be had, has been provided heretofore by approaches that require manually correlating the design and its detailed layout. This is a tedious, slow and error-prone process. Moreover, such approaches are often unavailable for the latest device architectures, and often require a good deal of experimentation to isolate the bits affected within a frame. Thus, it has been almost impossible to state with complete confidence that all essential bits have been identified using these existing tools, and to correlate the essential bits thus identified to their corresponding logic element.

By contrast, a bitstream view such as is provided by the present invention can be generated for any instance of any design element in any architecture. Flexible and automated reconfiguration flows are thus made possible, since it is not necessary to fix the location of components modified at run time, nor manually determine their positions. Identification by name allows the components to be placed anywhere in the target device. Moreover, there is no need to run multiple ancillary tools, and so the amount of information required in application programming interfaces (APIs) and design environment documentation is greatly reduced.

These embodiments of the present invention also provides efficient, convenient and architecture-independent techniques for identifying essential configuration bits of a given design, and provides accurate data regarding configuration bit utilization. These benefits are important in a number of situations. For example, "rule of thumb" approximations are typically used to assess the likelihood of a configuration bit single-event upset causing a circuit malfunction. However, end-users often desire actual statistics for designs operating in extreme environments (e.g., high-altitude and space environments), without having to provide the (possibly classified) designs to the manufacturer of the given programmable logic device for analysis. A tool that accurately and thoroughly identifies essential configuration bits complements experimental testing of design robustness in the presence of artificially induced configuration upsets. Knowing the function of the changed bits that may result from such testing can help to determine what corrective actions need to be taken, if any. Some embodiments of present invention provides for such analyses.

Conversely, a knowledge of "don't care" configuration bits has other uses. The configuration bit coverage achieved by a set of designs is useful for validating the code that implements the configuration bitstream generation module, the configuration hardware and other elements of the design environment. Moreover, bitstream compression can be improved, because multi-frame writes are possible for sets of identical frames. Unused configuration bits can be used to watermark designs and IP cores.

Figure 1:
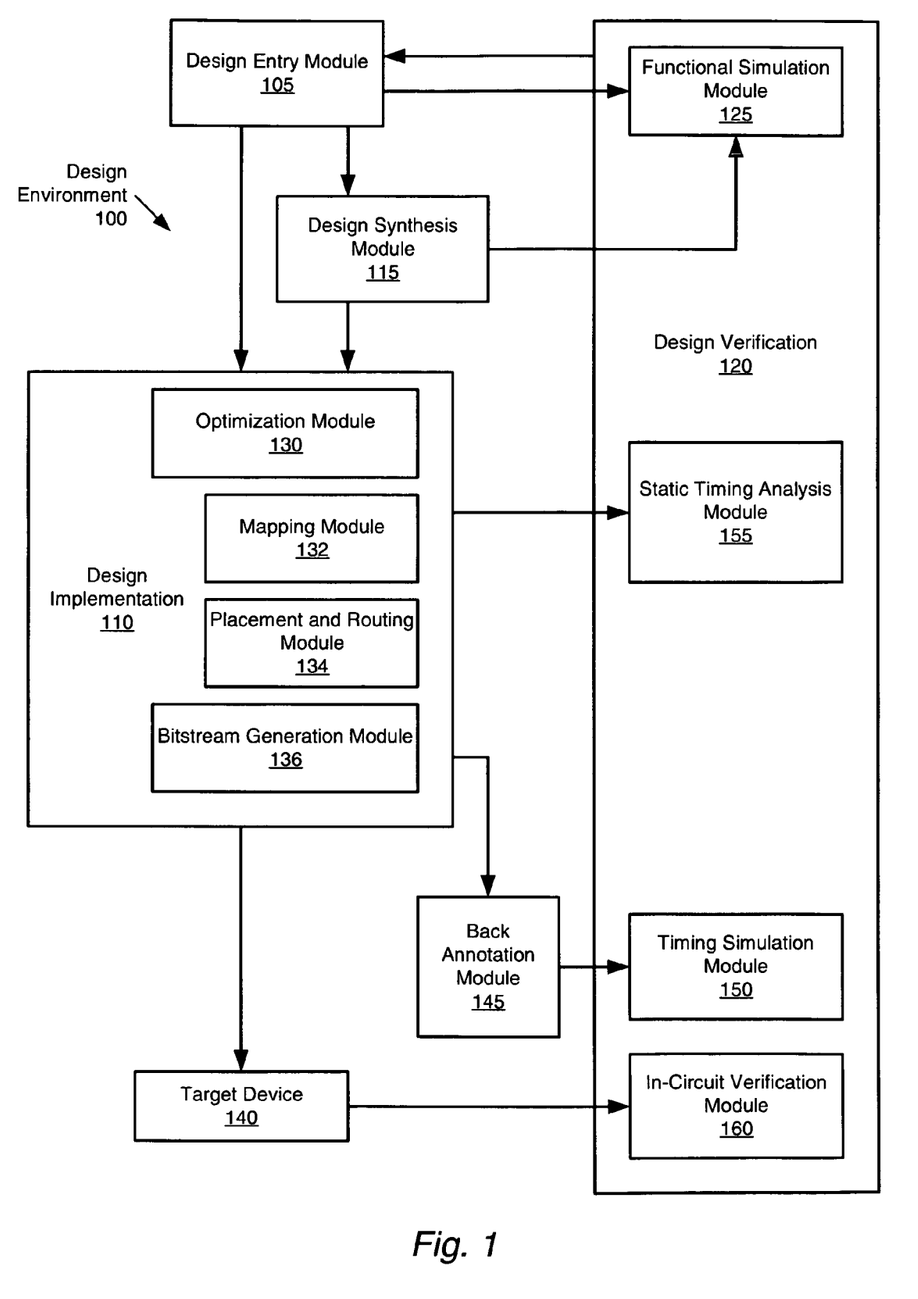
FIG. 1 is a block diagram illustrating an example of an overall design flow according to embodiments of the present invention.

An Example Architecture for Design Entry and Generation of Configuration Bitstreams FIG. 1 is block diagram of a design environment 100 that is capable of employing the present invention. Design environment 100 includes a design entry module 105, which allows a designer to enter a design into design environment 100. A design entered using design entry module 105 is then taken as input by a design implementation module 110.

Additionally, one or more portions of the design entered using design entry module 105 can be synthesized using a design synthesis module 115. Once synthesized, these portions can be provided to a design verification module 120, and in particular, a functional simulation module 125, thereof. The synthesized portions of the design generated by design synthesis module 115 are also provided to design implementation module 110. Typically, this occurs after the synthesized portions of the design have been simulated using functional simulation module 125. Other portions of the design entered via design entry module 105 are also provided to functional simulation module 125 of design verification module 120. By providing the design to functional simulation module 125 (both the portions entered by the designer using design entry module 105, and the portions of that design synthesized by design synthesis module 115), a complete functional simulation of the design can be performed.

Once the design (both designer-entered and synthesized portions of the design) have been provided to design implementation module 110, a number of processes are then performed on the design in order to prepare the design for being programmed into a target device. Among these are optimization (performed by optimization module 130), mapping (performed by a mapping module 132), placement and routing (performed by a placement and routing module 134), and bitstream generation (performed by a bitstream generation module 136).

The optimization performed by optimization module 130 can include, for example, two-level and multi-level optimization, as well as device-specific logic packing. The objective of such optimization is to decrease the area required by the combinational logic, to reduce the number of logic levels, or both. The mapping performed by mapping module 132 maps the components of the design into elements that exist within the target device in which the design is to be implemented.

Once optimization and mapping (via the selection of elements within the target device) have been performed, placement of the identified elements within the target device is performed by placement and routing module 134, as is the routing of connections between those elements. The placement operations performed can be equated to the selection of which elements within the target device will be used to perform a given function. Once the requisite elements of the target device are identified and placed, and the routing of connections between these elements has been determined, a bitstream can be generated. This bitstream represents the programming of the target device that is needed to provide such elements and connections. Such a bitstream is generated by bitstream generation module 136. This bitstream is then downloaded by design implementation module 110 to the target device (represented in FIG. 1 as a target device 140).

Design implementation module 110 also can provide for back annotation by providing place and route information to a back annotation module 145, which in turn provides information regarding the design to a timing simulation module 150. Design implementation module 110 can also provide information to a static timing analysis module 155. By allowing the performance of static timing analysis (via static timing analysis module 155) and dynamic timing analysis (provided by timing simulation module 150), as well as information regarding the design generated by functional simulation module 125, design verification module 120 is able to feedback information to design entry module 105 in order to allow defects in the design to be corrected.

This process of implementing a design using design implementation module 110 and feedback to design verification module 120 also allows a design to be optimized in an iterative manner. Once a design has been optimized in this manner, the design can then be downloaded to target device 140, as noted. Once downloaded to target device 140, in-circuit verification can be performed using an in-circuit verification 160 of design verification module 120. As before, the information generated by in-circuit verification module 160 can be fed back from design verification module 120 to design entry module 105, in order to optimize the design.

Regarding the signals and information described herein, those skilled in the art will recognize that a signal may be directly transmitted from a first block to a second block, or a signal may be modified (e.g., amplified, attenuated, delayed, buffered, inverted, filtered or otherwise modified) between the blocks. Although the signals of the above described embodiment are characterized as transmitted from one block to the next, other embodiments of the present invention may include modified signals in place of such directly transmitted signals as long as the informational and/or functional aspect of the signal is transmitted between blocks. To some extent, a signal input at a second block may be conceptualized as a second signal derived from a first signal output from a first block due to physical limitations of the circuitry involved (e.g., there will inevitably be some attenuation and delay). Therefore, as used herein, a second signal derived from a first signal includes the first signal or any modifications to the first signal, whether due to circuit limitations or due to passage through other circuit elements which do not change the informational and/or final functional aspect of the first signal.

The foregoing described embodiment wherein the different components are contained within different other components (e.g., the various elements shown as components of design environment). It is to be understood that such depicted architectures are merely examples, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "[operably] connected", or "[operably] coupled", to each other to achieve the desired functionality.

Figure 2:
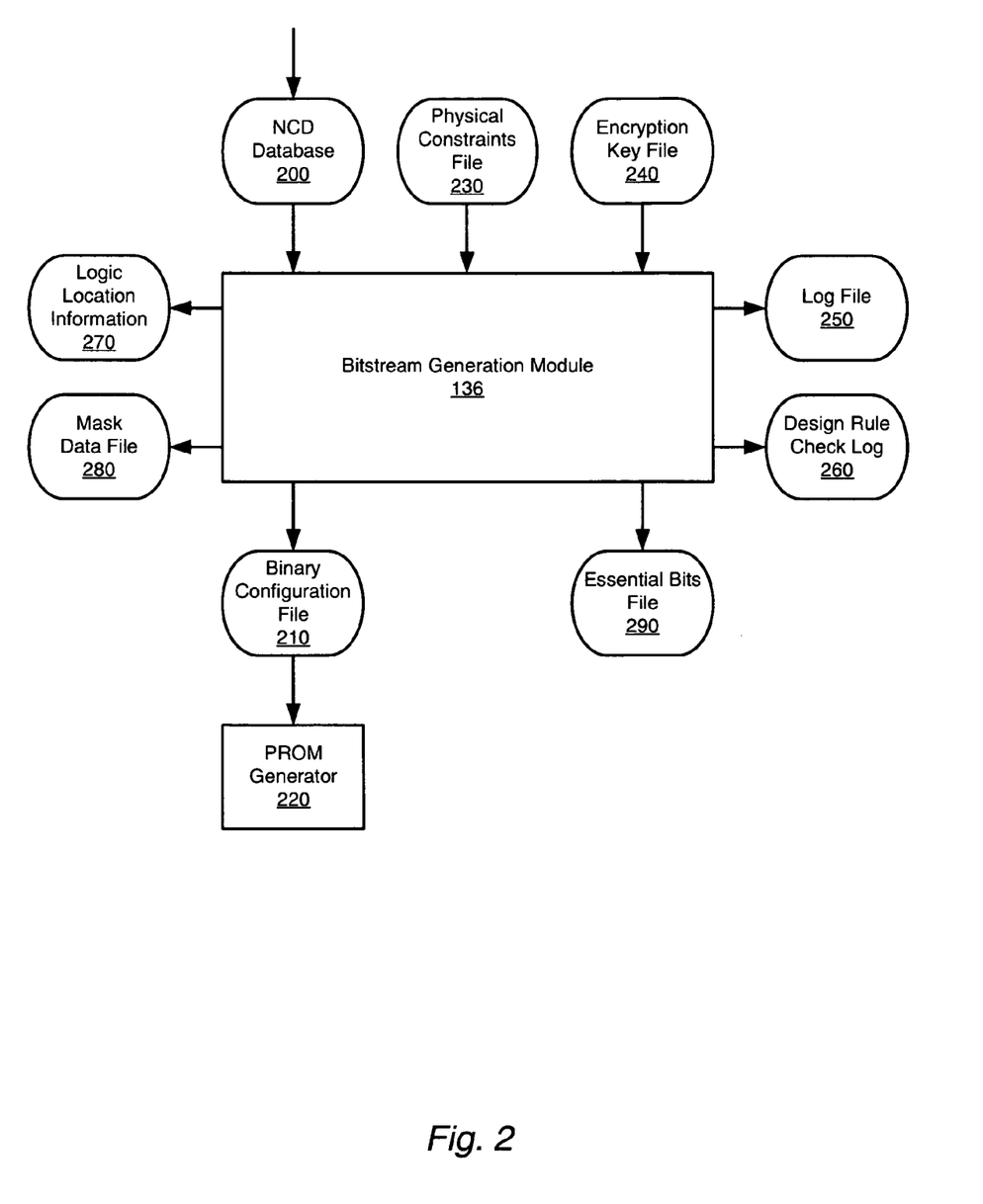
FIG. 2 is a block diagram illustrating in greater detail a bitstream generation module according to the present invention.

FIG. 2 is a block diagram illustrating in greater detail bitstream generation module 136, as well as the various files used by and generated by bitstream generation module 136. Bitstream generation module 136 receives a physical description of the design that has been mapped, placed and routed for downloading into the target device. This circuit description is received from placement and routing module 134 in the form of a native circuit description (NCD) database 200. In turn, bitstream generation module 136 takes the information in NCD database 200, as well as information stored in other files, and generates a configuration bitstream. This configuration bitstream is a binary file that contains the requisite configuration information, which defines the internal logic and interconnections to be implemented by the target device (e.g., a field-programmable gate array (FPGA)), as well as device-specific information from other files associated with target device. This configuration bitstream is depicted in FIG. 2 as a binary configuration file 210.

Binary configuration file 210 can be downloaded into the target device, or can be used to create a file for use in programming a programmable read-only memory (PROM) device. In the latter case, a PROM file containing the requisite information is generated by a module such as PROM generator 220 of FIG. 2, which generates a PROM file from the configuration bitstream stored in binary configuration file 210.

Bitstream generation module 136 generates binary configuration file 210 using the information in NCD database 200, but can also employ information from other sources. The first of these sources is a physical constraints file 230. Physical constraints file 230 contains constraints on the physical implementation of a given design. Physical constraints can result from attributes assigned within a schematic or hardware description language (HDL) description, user-entered constraints, netlist constraints produced by design tools or other such sources.

Typically, these constraints are categorized as either physical constraints generated by a tool during the design process or physical constraints entered by the user. Such constraints may be of a number of types, including timing constraints, placement constraints, grouping constraints, mapping constraints, routing constraints, modular design constraints, synthesis constraints, and other such constraints. These constraints are used by bitstream generation module 136 as part of the process of generating the configuration bitstream, to guide bitstream generation module 136 in meeting the needs of the tools and user in converting the physical circuit description of NCD database 200 into the configuration bitstream of binary configuration file 210.

Bitstream generation module 136 can also employ an encryption key file 240. Encryption key file 240 contains encryption information that allows bitstream generation module 136 to encrypt the configuration bitstream output when generating binary configuration file 210. The use of encryption key file 240 and the information contained therein provides design security through encryption of the configuration bitstream.

Bitstream generation module 136 also generates a number of output files, for purposes of providing the user with information regarding the process of bitstream generation and to provide the user with information regarding the design generated by bitstream generation module 136 (i.e., the configuration bitstream representing the design, and stored as binary configuration file 210). The first of these files is a log file 250. Log file 250 contains log information that reflects the operation of bitstream generation module 136. This information includes, typically, command line options, information regarding errors that may have occurred, and warnings produced during the operation of bitstream generation module 136. As will be appreciated, log file 250 can be made to contain any information relevant to the operation of bitstream generation module 136.

Bitstream generation module 136 can also invoke design rule checking in order to detect any errors in the given design that could cause the target device to malfunction. This design rule checking results in bitstream generation module 136 generating a design rule check log 260. Design rule check log 260 includes log information such as design rule errors and warnings generated based on the design rules employed.

Bitstream generation module 136 can also be configured to generate logic location information (depicted in FIG. 2 as logic location information 270). Logic location information 270 includes information of each of the nodes in the design that can be captured for readback. As will be appreciated, while configuration (using a configuration bitstream) is the process of loading a design bitstream into a target device, readback is the process of reading that information back (i.e., reading the information out of the target device). Thus, logic location information 270 can be employed in reading out a configuration bitstream from a target device such as target device 140. Logic location information 270 includes information such as absolute bit positions in the readback stream, frame address information, frame offset information, information regarding logic resources used and other related information.

Bitstream generation module 136 can also be configured to produce a mask data file 280. Mask data file 280 includes information regarding the configuration of the target device. Thus, mask data file 280 will typically include the same information with regard to configuration commands, as the configuration bitstream generated by bitstream generation module 136 (binary configuration file 210). However, mask data file 280 contains mask information in place of the configuration bitstream information that would normally be stored in binary configuration file 210. This mask information is used to compare relevant bit locations for executing a readback of configuration data contained in a target device that has been programmed using a corresponding configuration bitstream such as would be stored in binary configuration file 210.

Bitstream generation module 136, in embodiments according to the present invention is also capable of generating an essential bits file 290. Essential bits file 290 contains information regarding the essential bits (also referred to herein as "care bits") of the given design. The essential bits are those configuration bits that are used to configure the target device when implementing the given design therein. The processes performed in identifying the essential bits of a given design, as well as identifying their relationship to the logical components that make up that design, are now discussed.

Figure 3:
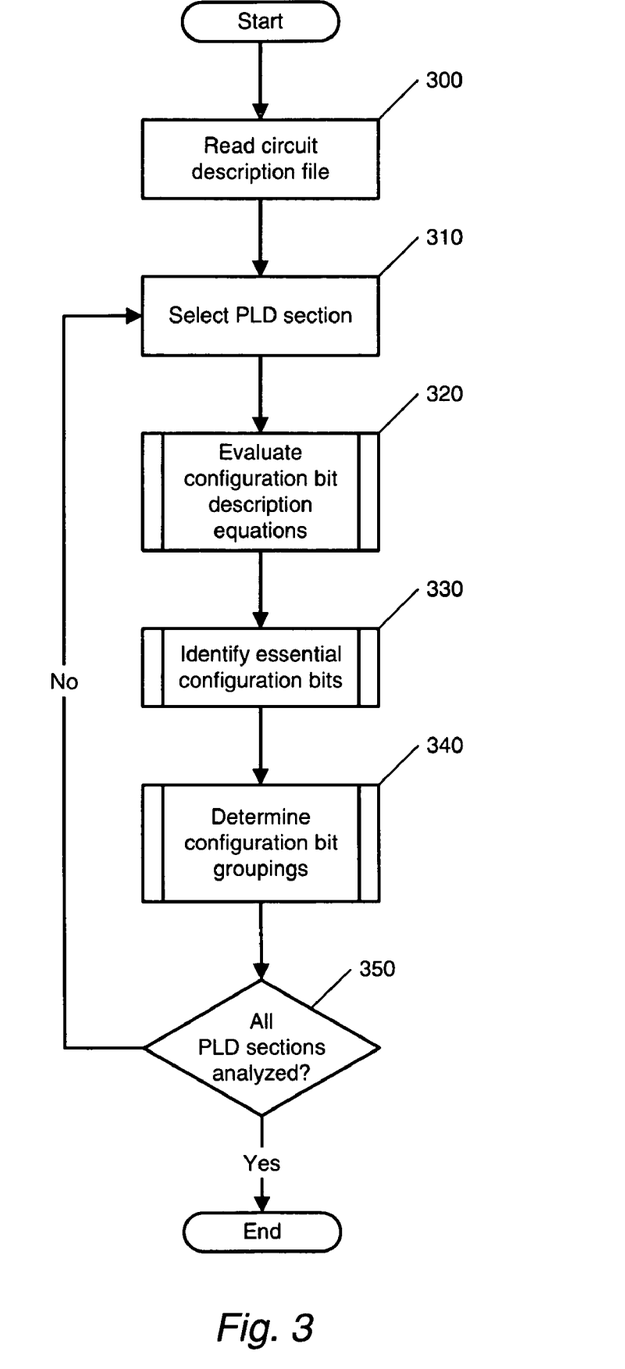
FIG. 3 is a flow diagram illustrating a process for identifying essential configuration bits according the present invention.

An Example of Processes Performed in Identifying Essential Bits and Generating a Bitstream View of a Design FIG. 3 is a flow diagram illustrating a process for identifying essential configuration bits according to an embodiment of the present invention. The process begins with the bitstream generation module reading a circuit description file (e.g., a native circuit description (NCD) file) for the given design (step 300). In doing so, the bitstream generation module determines the logic and routing resources used by that design. A section of the PLD design (e.g., a tile of an FPGA design) is then selected for analysis (step 310).

Next, the bitstream generation module evaluates configuration bit definitions (step 320). Information regarding such configuration bit definitions describes the manner in which configuration bits and their values are defined (or determined, in a functional sense). For purposes of the present discussion, this information is referred to herein as configuration bit description (CBD) equations, which are read and then collated from the perspective of configuration bits. As will be appreciated, the CBD equations described herein are but one of a number of ways in which such information can be represented. The present invention is therefore intended for use with any technique that allows for the proper setting of configuration bits can be used.

The essential configuration bits are then identified (step 330) The CBD equation for each bit is specialized so that the CBD equation in question references the corresponding design element. If no design element exists through a corresponding configuration bit, then the reference is set to null. In doing so, the bitstream generation module determines the groupings of configuration bits (step 340). A determination is then made as to whether the PLD section just analyzed was the last such section to be analyzed (350). If PLD sections remain to be analyzed, the next PLD section is selected (step 310). Otherwise, the process concludes. The foregoing operations are discussed in greater detail in connection with FIGS. 4, 5, 6 and 7.

With regard to FIG. 3, a flow diagram is depicted illustrating a process according to an embodiment of the present invention, as is the case with others of the figures described herein. It is appreciated that operations discussed herein may consist of directly entered commands by a computer system user or by steps executed by application specific hardware modules. The functionality of steps referred to herein may correspond to the functionality of modules or portions of modules.

The operations referred to herein may be modules or portions of modules (e.g., software, firmware or hardware modules). For example, while the described embodiment includes field-programmable application specific hardware modules, the various example modules may be software modules and/or include manually entered user commands. The software modules discussed herein may include script, batch or other executable files, or combinations and/or portions of such files. The software modules may include a computer program or subroutines thereof encoded on computer-readable media.

Additionally, those skilled in the art will recognize that the boundaries between modules are merely illustrative and alternative embodiments may merge modules or impose an alternative decomposition of functionality of modules. For example, the modules discussed herein may be decomposed into submodules to be executed as multiple computer processes, and, optionally, on multiple computers. Moreover, alternative embodiments may combine multiple instances of a particular module or submodule. Furthermore, those skilled in the art will recognize that the operations described in example embodiment are for illustration only. Operations may be combined or the functionality of the operations may be distributed in additional operations in accordance with the invention.

Alternatively, such actions may be embodied in the structure of circuitry that implements such functionality, such as the micro-code of a complex instruction set computer (CISC), firmware programmed into programmable or erasable/programmable devices, the configuration of a field-programmable gate array (FPGA), the design of a gate array or full-custom application-specific integrated circuit (ASIC), or the like.

Returning to FIG. 3, the configuration bitstream generator determines the value of each configuration bit by evaluating a corresponding Configuration Bit Description (CBD) equation, as noted. These equations consist of assignments, where the left-hand side is a configuration bit name, and the right-hand side is a Boolean expression to be evaluated. These expressions include the following components:

(1) Boolean constants TRUE and FALSE
(2) Logical operators
&& (AND),
|| (inclusive OR), and
! (NOT)
(3) Parentheses
(4) CBD functions:
arcinv(node1, node2)
  true if node1 and node2 are connected through an inverter
arcinv(node1, node2, TRUE)
  true if node1 drives node2 through an inverter
arcval(node1, node2)
  true if node1 and node2 are connected (regular arc)
arcval(node1, node2, TRUE)
  true if node1 drives node2 (directed arc)
cmdarg(option, value)
  true if option was set to value through a command line argument
comp(sitename)
  true if site sitename is used in the design
config(sitename, primname, config)
  true if attribute primname of site sitename is set to value config
memory(sitename, bank, bit)
  true if bit bit in bank bank of site sitename is 1
nodeused(node)
  true if node node is used in the design
noderouted(node)
  true if node node belongs to a routed net in the design
pminfo(sitename, config, bit)
  callback function
pminfo(sitename, config)
  callback function
pminfo (parameter)
  callback function
readback(sitename, node)
  true if flip-flop output node of site sitename is 1 during readback
sitetype(sitename, sitetype)
  true if site sitename is of type sitetype
tiletype(tilename, row, col)
  true if tile at offset [row, col] is of type tilename As will be appreciated, the above expressions reflect but one embodiment of a syntax according to the present invention. It will be apparent to those of skill in the art, in light of the present disclosure, that other expressions can also be used with equal success, as can other syntactic and programmatic constructs (multi-dimensional tables, multi-dimensional linked lists, or other alternatives). Examples of such CBD equations are:

Iiob mc1.Ipdown=!((config(IOB1, PULL, PULL-DOWN)|| (!comp(IOB1) && cmdarg(UnusedPin, Pulldown) && !pminfo(IOB1, VREF) && !pminfo(IOB1, VR))));

Icle.Imc imux.I107=arcval(OMUX2, G4 B2)|| arcval(X3, G4 B2) || arcval(OMUX S0, G4 B2) || arcval(Y0, G4 B2);

Icle.Iluts s2s0.Is0.g lut.Imem0.Ilut memce11=memory (SLICE0 SITE, 1, 15);

The first equation defines the conditions under which an input/output (I/O) block (IOB) uses a pulldown, the second equation defines one of the select bits in a configurable logic block (CLB) IMUX, and the third equation defines the high-order bit in a G-LUT.

Identification of Essential Configuration Bits of a Design

A configuration bitstream generator (e.g., bitstream generation module 136) determines the logic and routing resources used by a design, typically while reading the NCD database. This design information is collated from the perspective of the configuration bits. The CBD equation for each bit is specialized so that the equation references the corresponding design element. If no design element exists for the configuration bit, then the reference is set to null.

Note that a design flow such as that described in the Background of the Invention uses the opposite approach. A configuration bitstream generator of the present invention identifies the design element(s) associated with each configuration bit, whereas the approach described in the Background of the Invention, for example, determines the configuration bit(s) associated with each design element (and then, only with a great deal of effort and limited accuracy). Hence, configuration bit coverage is also more difficult to validate in the latter design flow.

For example, some configuration bits may be missing from the resulting database, particularly in corner and termination tiles. Even if a configuration bit is known in such an approach, that configuration bit may be omitted from the code that enumerates the bits associated with a given logic element, because information regarding the relationship between the two is not (and cannot be) maintained. Identifying used configuration bits in the manner of an embodiment of the present invention, by contrast, allows a grouping algorithm employed in a configuration bitstream generator of the present invention to perform such grouping quickly and accurately, as noted subsequently.

The configuration bitstream generator iterates over each configuration bit of each tile, in order to evaluate the CBD equations. For at least one configuration bit in a group, a determination can be made as to whether the given configuration bit is used. The analysis depends on the equation type:

Equations using arcval( ) and arcinv( ): These are used to define PIP and multiplexer resources. The configuration bit is essential if the second node referenced is used in the design.

Equations using comp( ): The configuration bit is essential if the sitename is occupied with a COMP.

Equations using config( ): This is used to define the configuration of primitives in sites such as slices. The configuration bit is essential if the sitename is occupied with a COMP and the primname is defined in the COMP's configuration string with a value other than "#OFF".

Equations using memory( ): This is used to define the contents of memory elements such as LUTs. The configuration bit is essential if the sitename is occupied with a COMP. Equations using nodeused( ), noderouted( ), cmdarg( ), sitetype( ) and tiletype( ): The configuration bit is essential if the function returns true.

Equations using pminfo( ) and readback( ): The configuration bit is essential if the sitename is occupied with a COMP.

In addition, configuration bits that are set (e.g., have a value of logic 1) are considered to be used (assuming the default state for such configuration bits is cleared). In the general sense, the inquiry addressed by the preceding tests is the determination of whether the function's resource (comp or node) argument exists. The above operations are presented graphically in connection with FIGS. 4, 5, 6 and 7.

Figure 4:
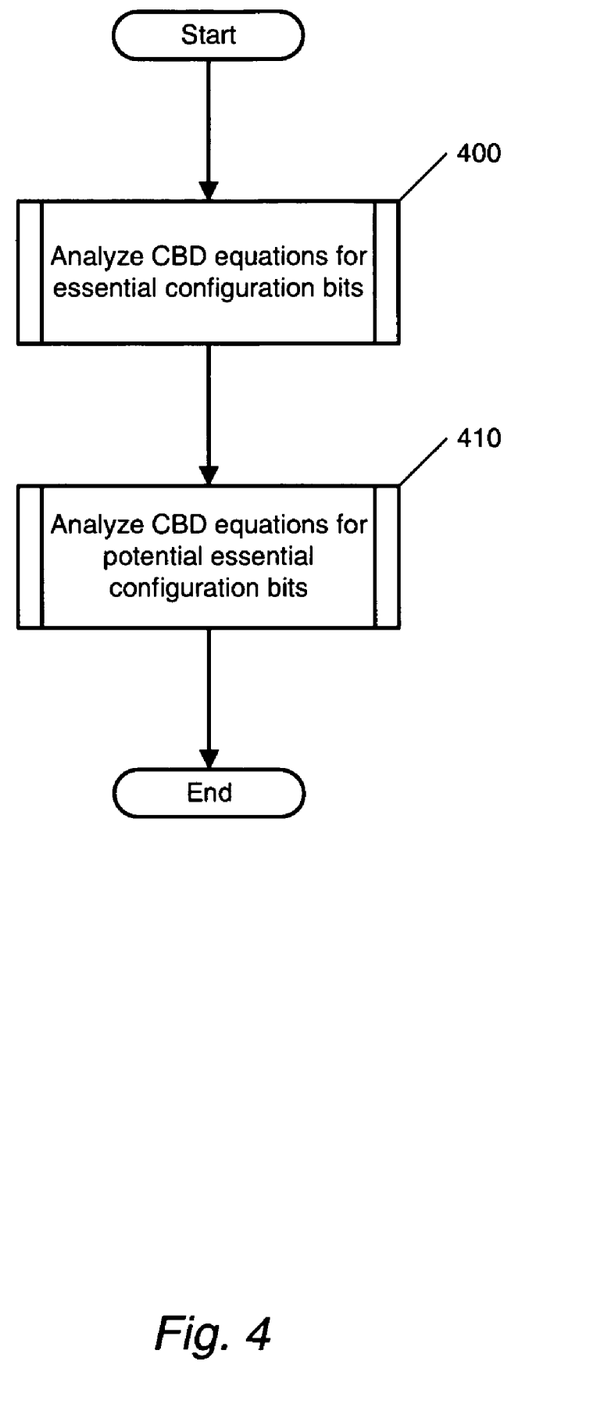
FIG. 4 is a flow diagram illustrating a process for identifying essential configuration bits according to the present invention.

FIG. 4 is a flow diagram illustrating a process for identifying essential configuration bits according to the present invention. The process begins with the identification of essential configuration bits via the direct identification of such configuration bits (step 400). This process is depicted in further detail in FIGS. 5 and 6, and includes the identification of those configuration bits that are set during the bitstream generation process. Next, potential essential configuration bits are identified (step 410), the process of which is depicted in further detail in FIG. 7. The direct identification of essential configuration bits is now described.

Figure 5:
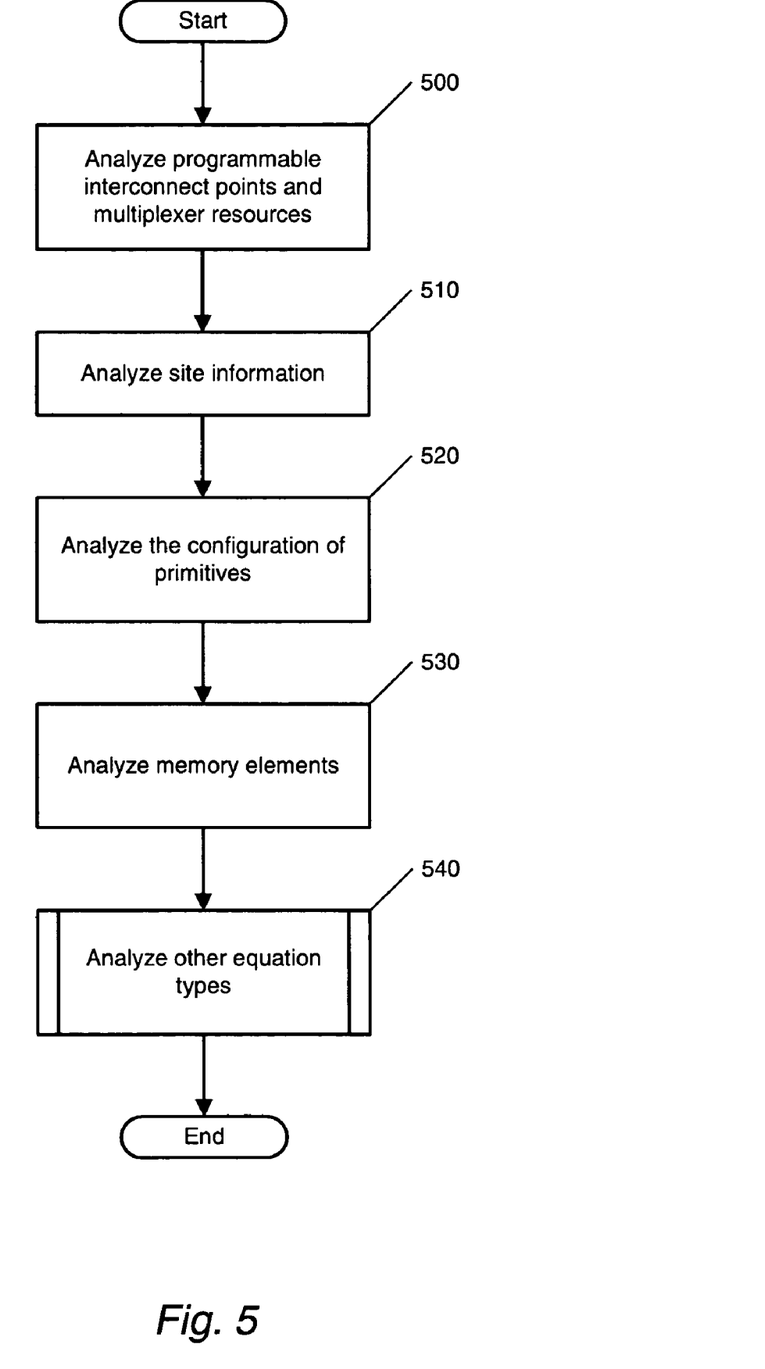
FIG. 5 is a flow diagram illustrating a process according to the present invention for evaluating CBD equations in order to determine configuration bit groupings.

FIG. 5 is a flow diagram illustrating the analysis performed in evaluating CBD equations in order to determine essential configuration bits, in a method according to the present invention. As will be appreciated, the function of identifying essential configuration bits can be performed in tandem with the process of identification. This is because, once the functions are identified, the configuration bits corresponding thereto can be determined.

The process begins with the analysis of the design's programmable interconnect points (PIPs) and multiplexer resources (step 500). In one embodiment, PIPs and multiplexer resources are defined by equations that use the arcval( ) and arcinv( ) functions, respectively (as noted earlier). The configuration bit in question is essential if any node referenced in the functions is used in the design.

Next, site information is analyzed (step 510). This allows analysis based on site name (by analyzing equations that include the comp( ) function), for example. The design's configuration primitives are then analyzed (step 520). This includes equations that use the config( ) function. The config( ) function is used to define the configuration of primitives (e.g., slices). The configuration bit in question is essential if both the site name and primitive name are used in the given design. The body of the config( ) function checks for these conditions.

Next, the content of memory elements are analyzed (step 530). This includes equations that use the memory( ) function, which is used to define the contents of memory components such as slices and block random access memory (BRAM) banks. The configuration bit in question is essential if the site name and bank are used in the design. Once the foregoing analyses have been completed, equations including other functions can also be analyzed (step 540), as is described below in connection with FIG. 6.

Figure 6:
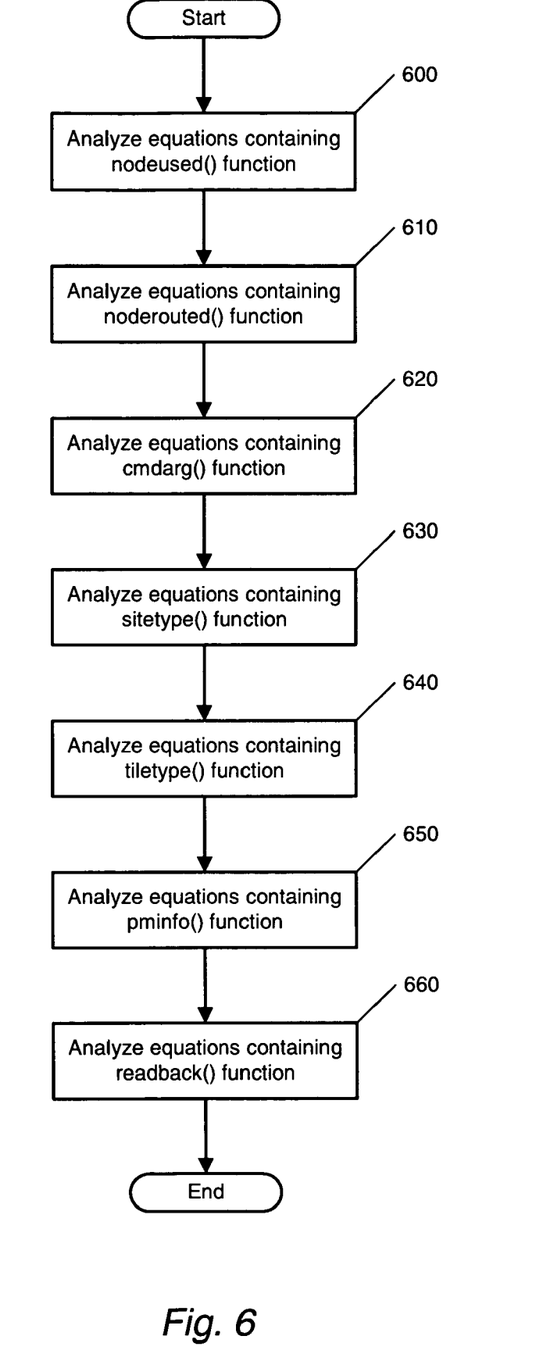
FIG. 6 is a flow diagram illustrating a process according to the present invention for analyzing equation types other than those specifically analyzed in the process of FIG. 5.

FIG. 6 is a flow diagram illustrating a process of analyzing equation types other than those specifically analyzed in the process depicted in FIG. 5. The process begins with the analysis of equations including nodeused( ) function (step 600). The nodeused( ) CBD function provides of way of determining whether a node is used, in this context. The configuration bit in question is essential if the node identified in the nodeused( ) function is used in the design. Each instance of the CBD function noderouted( ) is then examined (step 610). The noderouted( ) function is true if the given node belongs to a routed net in the design, and so the configuration bit in question is essential if such is the case.

Next, CBD equations including the cmdarg( ) functions are analyzed (step 620). The cmdarg( ) function is true (and so the given configuration bit is essential) is a given option has been set to a given value through a command line argument. CBD equations including the sitetype( ) functions are then analyzed (step 630). The sitetype( ) function indicates whether a given site name is of a given sitetype, and the configuration bit in question is essential if such is the case. Next, CBD equations including tiletype( ) functions are then analyzed (step 640). The tiletype( ) function is true if a tile at a given offsite is of a given type, and the configuration bit in question is essential if such is the case.

CBD equations including one or more pminfo( ) functions are then analyzed (step 650). The pminfo( ) function is a callback function that allows linking to the internal code of the bitstream generation module, in cases where such a capability is advantageous. CBD equations including one or more readback( ) functions are then analyzed (step 660). The readback( ) function is true if the configuration bit for a given output node is true (asserted) during readback, and the configuration bit in question is essential if such is the case. For example, if a flip-flop output node is one during readback, the readback( ) function returns a return value of true.

At the end of evaluating the CBD equations for a tile, the configuration bits that have not been added to the set of essential configuration bits (ECB; the essential set) are instead added to a "potential" essential configuration bit (PECB) set. The CBD terms for each essential configuration bit are compared with the CBD terms for each potentially essential configuration bit. This comparison can be performed in a reasonable amount of time because the comparison is only made with respect to the configuration bits in a tile, rather than to all the configuration bits in a device.

Figure 7:
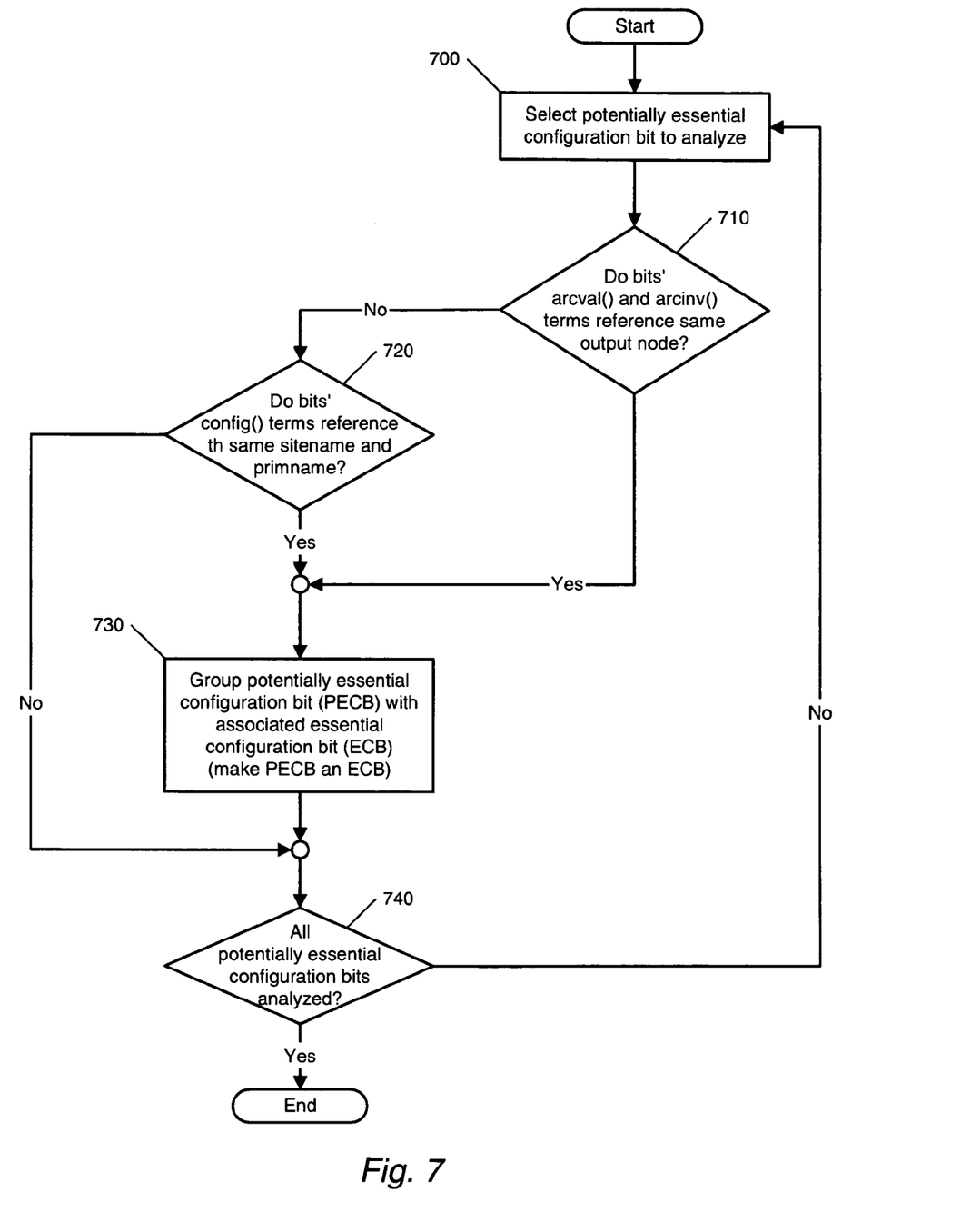
FIG. 7 is a flow diagram illustrating a process for identifying potentially essential bits according to the present invention.

FIG. 7 is a flow diagram illustrating the analysis performed in evaluating CBD equations in order to determine whether to identify a potentially essential configuration bit as an essential configuration bit, in a method according to an embodiment of the present invention.

First, a potentially essential configuration bit is selected (step 700). A potential bit is grouped with the given essential bit (and so becomes an essential bit) if:

1. Both bits have arcval( ) and arcinv( ) terms that reference the same output node (step 710); or 2. Both bits have config( ) terms that reference the same sitename and primname (step 720).

If either of these conditions exists, the given potentially essential configuration bit is grouped with its corresponding essential configuration bit (and so the PECB itself becomes an ECB) (step 730), thus identifying the PECB as an ECB. The process then repeats for each potentially essential configuration bit (step 740).

Examples of matches from the earlier example CBD equations might appear as follows:

1. Icle.Imc imux.I125=arcval (W2END4, BY0) ǁ arcval (N2END4, BY0) ǁ arcval (N2MID4, BY0) ǁ arcval (W2MID2, BY0) ǁ arcval (OMUX W6, BY0) ǁ arcval (S2BEG4, BY0) ǁ arcval (W2BEG4, BY0) ǁ arcval (E2BEG3, BY0); Icle.Imc imux.I126=arcval (E2MID4, BY0) arcval (BX2, BY0, TRUE) ǁ arcval (S2MID3, BY0) ǁ arcval (BX3, BY0) ǁ arcval (OMUX N12, BY0) ǁ arcval (OMUX E7, BY0) ǁ arcval (OMUX NE12, BY0) ǁ arcval (OMUX WN14, BY0);

2. Icle.Iluts s2s0.1s0.Iws gen.Imc gshr=config (SLICE0 SITE, G ATTR, SHIFT REG);
Icle.Iluts s2s0.Is0.Iws gen.Imc gram=config (SLICE0 SITE, G, "#RAM") && ! config (SLICE0 SITE, G ATTR, SHIFT REG);

3. Icle.Iluts s2s0.1s0.g lut.Imem0.Ilut memcell=memory (SLICE0 SITE, 1, 15);
Icle.Iluts s2s0.1s0.g lut.Imem1.Ilut memcell=memory (SLICE0 SITE, 1, 14);
Icle.Iluts s2s0.1s0.g lut.Imem2.Ilut memcell=memory (SLICE0 SITE, 1, 13);
Icle.Iluts s2s0.Is0.g lut.Imem3.Ilut memcell=memory (SLICE0 SITE, 1, 12);
Icle.Iluts s2s0.Is0.g lut.Imem4.Ilut memcell=memory (SLICE0 SITE, 1, 11);
Icle.Iluts s2s0.Is0.g lut.Imem5.Ilut memcell=memory (SLICE0 SITE, 1, 10);
Icle.Iluts s2s0.Is0.g lut.Imem6.Ilut memcell=memory (SLICE0 SITE, 1, 9);
Icle.Iluts s2s0.Is0.g lut.Imem7.Ilut memcell=memory (SLICE0 SITE, 1, 8);
Icle.Iluts s2s0.Is0.g lut.Imem8.Ilut memcell=memory (SLICE0 SITE, 1, 7);
Icle.Iluts s2s0.Is0.g lut.Imem9.Ilut memcell=memory (SLICE0 SITE, 1, 6);
Icle.Iluts s2s0.Is0.g lut.Imem10.Ilut memcell=memory (SLICE0 SITE, 1, 5);
Icle.Iluts s2s0.Is0.g lut.Imem11.Ilut memcell=memory (SLICE0 SITE, 1, 4);
Icle.Iluts s2s0.Is0.g lut.Imem12.Ilut memcell=memory (SLICE0 SITE, 1, 3);
Icle.Iluts s2s0.Is0.g lut.Imem13.Ilut memcell=memory (SLICE0 SITE, 1, 2);
Icle.Iluts s2s0.Is0.g lut.Imem14.Ilut memcell=memory (SLICE0 SITE, 1, 1);
Icle.Iluts s2s0.Is0.g lut.Imem15.Ilut memcell=memory (SLICE0 SITE, 1, 0);

4. Iiob mc0.Ianx=pminfo(IOB0, OSTD, BIT3) ǁ pminfo (IOB0, ISTD, BIT6);
Iiob mc0.Ibufcfg0=pminfo(IOB0, ISTD, BIT0);
Iiob mc0.Ibufcfg1=pminfo(IOB0, ISTD, BIT1);
Iiob mc0.Ibufcfg2=pminfo(IOB0, ISTD, BIT2);
Iiob mc0.Itype0=pminfo (IOB0, ISTD, BIT5) ǁ pminfo (IOB0, OSTD, BIT23);
Iiob mc0.Itype1=pminfo (IOB0, ISTD, BIT4) pminfo (IOB0, OSTD, BIT22);
Iiob mc0.Itype2=pminfo (IOB0, ISTD, BIT3) ǁ pminfo (IOB0, OSTD, BIT21);

The first example groups the two select bits for the IMUX BY0 output, the second example groups the two bits defining the slice 0 G-LUT mode, the third example groups the sixteen slice 0 G-LUT initialization bits, and the fourth example groups the seven 10B bits defining the input I/O standard. It will be noted that the match is performed on any term in an equation, and that matches have tile scope.

Identifying used configuration bits in the manner of an embodiment of the present invention allows a grouping algorithm employed in a configuration bitstream generator of the present invention to perform such grouping quickly and accurately, as noted earlier. A description of the manner and use of such grouping in providing a bitstream view of a PLD design is now provided.

Providing a Bitstream View by Correlating Essential Configuration Bits to Logic Elements As noted, techniques according to the present invention allow for the correlation of a physical circuit description (e.g., one or more of a PLD design's essential configuration bits) and a logical circuit description (e.g., one or more of the logic elements that make up a PLD design), which can also be viewed as correlating one or more of the physical elements of the design's implementation in the PLD with one or more of the design's logical elements. This correlation is based on the inventors' observation that, if configuration bits have similar terms in their CBD equations, those configuration bits control the same instance of a resource of a programmable logic device (or more simply, a resource). Resources include, but are not limited to: routing resources, logic resources, memory resources, informational resources and the like. The use of the term "similar" depends upon the type of resource, for example:

1. For routing resources, the second argument in an arcval( ) or arcinv( ) term (which corresponds to the output of a multiplexer) is the resource to be matched.
2. For logic resources affected by a config( ) term, the sitename and primname arguments should match.
3. For memory( ). terms, the sitename and bank arguments should match.
4. For pminfo( ) terms, the sitename and config arguments should match.

Although related configuration bits will often have their equations grouped together in the CBD file, this can not be assumed, and so grouping operations are needed, as noted.

Figure 8:
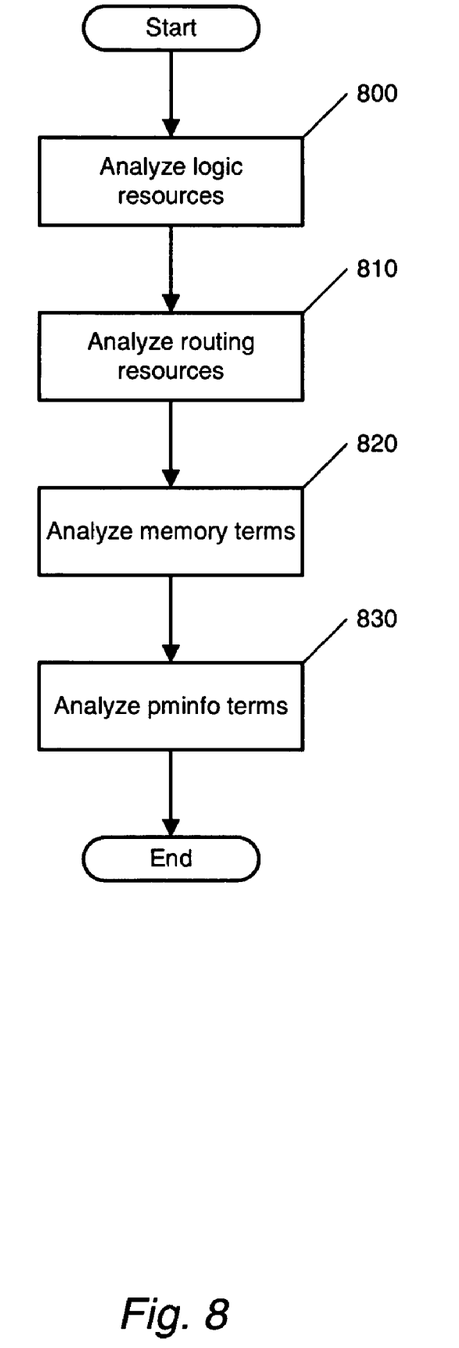
FIG. 8 is a flow diagram illustrating a process for grouping essential configuration bits according to the present invention.

FIG. 8 is a flow diagram illustrating a process for evaluating CBD equations according to the present invention, as just described. The process begins with a determination as to the routing resource groupings for the given design (step 800). Next, a determination is made as to the logic resource groupings for the given design (step 810). Once the logic resource and routing resource groupings for the design have been determined, a determination is made as to the memory terms involved in the CBD equations, in order to determine the memory resource groupings (step 820). Similarly, the determination is made as to the pminfo terms involved in the given CBD equation, in order to determine the pminfo resource groupings (step 830).

As will be appreciated, once the correlation between the essential configuration bits of a design and the design's logic elements is made, a wide variety of views of the design can be provided. This includes logical/physical views, hierarchical/flat views, timing views, and bitstream views, allowing the designer the clearest possible understanding of the given design.

Configuration of a Bitstream Generation Module Capable of Correlating Essential Configuration Bits to Logic Elements As noted, the present invention can be implemented, for example, in a bitstream generation module such as bitstream generation module 136. In such a case, bitstream generation module 136 produces an ".eb" file (e.g., essential bits file 290) that describes the essential configuration bits.

In some embodiments, the essential bits file follows the file format of the file containing logic location information 270. For example, in one embodiment, header lines begin with a semicolon. The first header line identifies the design name, architecture, part name, the number of rows and columns in the configuration bitmap, the number of used configuration bits, the total number of bits in the configuration bitmap and other such information. The remaining header lines can show, for example, the environment variable settings.

Each remaining line describes a used configuration bit identified by its:
frame address (in hex),
offset within the frame,
configuration bit value,
tile row and column coordinates, and tile name,
configuration bit row and column coordinates, and configuration bit name,
if this bit is associated with an NCD COMP (component), the user-assigned comp name is given,
if this bit is associated with an NCD COMP, the site coordinates for the comp are given,
if this bit is associated with an NCD NODE, the user-assigned signal name is given, a term of the CBD equation.

The configuration bits are typically sorted in ascending order by frame address. Bits with the same frame address are typically sorted in ascending order by offset within the frame.

Since the number of used configuration bits can be quite large in certain embodiments, environment variables can be employed to provide filter and detail options:

Setting LIST BITS to 1 causes the essential bit file to describe each used configuration bit. If this variable is not set, then the essential bit file will only contain summary information such as the number of used configuration bits. The OMIT environment variables have no effect if this option is not set.

Setting SKIP STRINGS to "string1:string2: . . . " prevents the essential bits file from including a configuration bit, if its tile or bit name contains one of the string substrings. For example, BRAM initialization and parity bits can be excluded by setting this variable to "BRAMSITE".

Setting COMP MATCH to "comp1:comp2: . . . " causes only those configuration bits associated with one of the NCD comp's to be included in the essential bits file. The comp name is the name of the design environment's site, and partial matches are acceptable. An example of a comp name pattern match is "fcport0/port outbound credit/data36 rxx2form".

Setting SITE MATCH to "site1:site2: . . . " causes only those configuration bits associated with one of the NCD site's to be included in the essential bits file. The site name is the name of the design environment's site, and partial matches are acceptable. For example, the configuration bits associated with all gigabit transceivers could be reported by setting this variable to "GT".

Setting OMIT ADDRESS to 1 prevents the frame address from being included in the description of each used configuration bit.

Setting OMIT OFFSET to 1 prevents the offset within the frame from being included in the description of each used configuration bit.

Setting OMIT VAL to 1 prevents the bit value from being included in the description of each used configuration bit.

Setting OMIT TILE to 1 prevents the tile coordinates and the tile name from being included in the description of each used configuration bit.

Setting OMIT NAME to 1 prevents the configuration bit coordinates within the tile and the configuration bit name from being included in the description of each used configuration bit.

Setting OMIT COMP to 1 prevents the associated NCD COMP name (if any) from being included in the description of each used configuration bit.

Setting OMIT SITE to 1 prevents the associated NCD site name (if any) from being included in the description of each used configuration bit. Only COMPs have sites.

Setting OMIT NODE to 1 prevents the associated NCD signal name (if any) from being included in the description of each used configuration bit. Only routing resources have signal names.

Setting OMIT CBD to 1 prevents any associated CBD equation term from being included in the description of each used configuration bit.

A master list of all configuration bits for a device can also be generated. In addition, the environment variables LIST BITS, OMIT VAL, OMIT COMP, OMIT SITE, OMIT MODE and OMIT CBD should be set to 1. The master list excludes unused configuration bits. The use of the term "unused bits" here is intended to designate the bits in the device that do not have any resource associated with them.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Moreover, while the invention has been particularly shown and described with reference to these specific embodiments, it will be understood by those skilled in the art that the foregoing and other changes in the form and details may be made therein without departing from the spirit or scope of the invention.

What is claimed is:

1. A method for generating a bitstream view of a device, comprising:
    correlating a physical circuit description and a logical circuit description, wherein
        said correlating uses a configuration bit definition; and
        said configuration bit definition is a configuration bit description (CBD) equation.

2. The method of claim 1, wherein said physical circuit description comprises a configuration bit, and said configuration bit is defined using said configuration bit definition.

3. The method of claim 2, further comprising:
    programming at least one programmable function block of a plurality of programmable function blocks using said configuration bit.

4. The method of claim 2, further comprising:
    identifying said configuration bit as an essential configuration bit, wherein said correlating is maintained during said identifying.

5. The method of claim 4, further comprising:
    generating a configuration bitstream, wherein
        said configuration bitstream comprises said configuration bit, and
        said generating comprises said identifying.

6. The method of claim 5, wherein said configuration bitstream is enabled to be used in programming a programmable logic device.

7. The method of claim 5, further comprising:
    programming a programmable logic device using said configuration bitstream.

8. The method of claim 1, wherein
    said CBD equation is specialized by virtue of said CBD equation being configured to reference a logic element.

9. The method of claim 1, wherein
    said logical circuit description comprises a logic element.

10. The method of claim 9, further comprising:
    identifying said configuration bit as an essential configuration bit, wherein said correlating is maintained during said identifying.

11. The method of claim 10, wherein
    said CBD equation defines said configuration bit such that said configuration bit causes said logic element to be implemented.

12. The method of claim 10, further comprising:
    generating a configuration bitstream, wherein
        said configuration bitstream comprises said configuration bit, and
        said generating comprises said identifying.

13. The method of claim 1, wherein said physical circuit description comprises a plurality of configuration bits, wherein said plurality of configuration bits comprise said configuration bit, and wherein said configuration bit controls a resource, and wherein said correlating comprises determining if a configuration bit of said Plurality of configuration bits also controls said resource, and wherein said determining uses said configuration bit definition, and wherein said CDB equation is one of a Plurality of CDB equations and wherein each of said CDB equations corresponds to one of said configuration bits, and wherein said determining further comprises determining if a term of said CDB equation is similar to a term of a CDB equations in said Plurality of CDB equations corresponding to said one of said configuration bits.

14. The method of claim 13, wherein said resource is selected from a group consisting of a routing resource, a logic resource, a memory resource and an informational resource.

15. The method of claim 13, further comprising:
    indicating that said term of said CDB equation and said term of said CDB equation of said plurality of CDB equations are similar, if said resource is a routing resource,
    said term of said CDB equation and said term of said one of said CDB equation of said Plurality of CDB equations are each one of an arcval( ) term and arcinv( ) term,
    a second argument of said term of said CDB equation and a second argument of said term of said CDB equation of said plurality of CDB equations match.

16. The method of claim 13, further comprising:
    indicating that said term of said CDB equation and said term of said CDB equation of said plurality of CDB equations are similar, if said resource is a logic resource, said term of said CDB equation and said term of said CDB equation of said plurality of CDB equations are each a config( ) term, a sitename argument and a primname argument of said term of said CDB equation, and a sitename argument and a primname argument of said term of said CDB equation of said plurality of CDB equations match.

17. The method of claim 13, further comprising:
    indicating that said term of said CDB equation and said term of said CDB equation of said plurality of CDB equations are similar, if said resource is a memory resource, said term of said CDB equation and said term of said CDB equation of said plurality of CDB equations are each a memory( ) term, a sitename argument and a bank argument of said term of said CDB equation, and a sitename argument and a bank argument of said term of said CDB equation of said plurality of CDB equations match.

18. The method of claim 14, further comprising:
    indicating that said term of said CDB equation and said term of said CDB equation of said plurality of CDB equations are similar, if said resource is a informational resource, said term of said CDB equation and said term of said CDB equation of said plurality of CDB equations are each a pminfo( ) term, a sitename argument and a config argument of said term of said CDB equation, and a sitename argument and a config argument of said term of said CDB equation of said plurality of CDB equations match.

19. A computer program product comprising:
a first set of instructions, executable on a computer system, configured to correlate a physical circuit description and a logical circuit description, wherein said correlating uses a configuration bit definition; and computer readable media, wherein said computer program product is encoded in said computer readable media, wherein
said Physical circuit description comprises a configuration bit, and said configuration bit is defined using said configuration bit definition:
wherein said configuration bit definition is a configuration bit description (CBD) equation,
said CDB equation is one of a Plurality of CDB equations,
each of said CDB equations corresponds to a configuration bit in a Plurality of configuration bits, and
said first sub-set of instructions comprises a first sub-set of instructions, executable on said computer system, configured to determine if a term of said CDB equation is similar to a term of a one of said CDB equations corresponding to said one of said configuration bits.

20. The computer program product of claim 19, further comprising:
a second set of instructions, executable on said computer system, configured to program at least one programmable function block of a plurality of programmable function blocks using said configuration bit.

21. The computer program product of claim 19, further comprising:
a second set of instructions, executable on said computer system, configured to identify said configuration bit as an essential configuration bit, wherein said second set of instructions are further configured to maintain said correlating.

22. The computer program product of claim 21, further comprising:
a third set of instructions, executable on said computer system, configured to generate a configuration bitstream, wherein said configuration bitstream comprises said configuration bit, and said third set of instructions comprises said second set of instructions.

23. The computer program product of claim 22, further comprising a programmable logic device configured to be programmed using said configuration bit in a configuration bitstream.

24. The computer program product of claim 22, further comprising:
a third set of instructions, executable on said computer system, configured to program a programmable logic device using said configuration bitstream.

25. The computer program product of claim 19, wherein said logical circuit description comprises a logic element.

26. The computer program product of claim 19, further comprising:
a second set of instructions, executable on said computer system and configured to identify said configuration bit as an essential configuration bit, wherein said second set of instructions are further configured to maintain said correlating.

27. The computer program product of claim 26, further comprising:
a third set of instructions, executable on said computer system, configured to generate a configuration bitstream, wherein
said configuration bitstream comprises said configuration bit, and
said third set of instructions comprises said second set of instructions.

28. The computer program product of claim 19, wherein said physical circuit description comprises a plurality of configuration bits, said configuration bits comprise said configuration bit, said configuration bit controls a resource, said first set of instructions comprises a first sub-set of instructions, executable on said computer system, configured to determine if a one of said configuration bits also controls said resource, wherein said first sub-set of instructions uses said configuration bit definition.

29. The computer program product of claim 28, wherein said resource is from a group comprising a routing resource, a logic resource, a memory resource and an informational resource.

30. An apparatus comprising:
means for identifying a configuration bit as an essential configuration bit;
means for correlating a physical circuit description and a logical circuit description, wherein:
said means for correlating uses a configuration bit definition, wherein said configuration bit definition is a configuration bit description (CBD) equation,
said means for correlating is maintained by said means for identifying;
wherein said CDB equation is one of a plurality of CDB equations, each of said CDB equations corresponding to a configuration bit of said plurality of configuration bits;
said means for correlating comprises means for determining if a configuration bit of said plurality of configuration bits also controls said resource; and
said means for determining uses said configuration bit definition; and
wherein said means for determining comprises means for determining whether a term of said CDB equation is similar to a term of a CDB equation of said plurality of CDB equations corresponding to said configuration bit of said plurality of configuration bits.

31. The apparatus of claim 30, wherein said physical circuit description comprises a configuration bit, and said configuration bit is defined using said configuration bit definition.

32. The apparatus of claim 31, further comprising:
means for programming at least one of a plurality of programmable function blocks using said configuration bit.

33. The apparatus of claim 31, further comprising:
means for generating a configuration bitstream, wherein
said configuration bitstream comprises said configuration bit, and
said means for generating comprises said means for identifying.

34. The apparatus of claim 33, further comprising a programmable logic device configured to be programmed using said configuration bit in said configuration bitstream.

35. The apparatus of claim 33, further comprising:
means for programming a programmable logic device using said configuration bitstream.

36. The apparatus of claim 31, wherein said logical circuit description comprises a logic element.

37. The apparatus of claim 36, wherein said means for correlating is maintained by said means for identifying.

38. The apparatus of claim 37, further comprising:
means for generating a configuration bitstream, wherein:
said configuration bitstream comprises said configuration bit, and
said means for generating comprises said means for identifying.

39. The apparatus of claim 31, wherein said physical circuit description comprises a plurality of configuration bits;
said Plurality of configuration bits comprise said configuration bit; and
a configuration bit of said plurality of configuration bits is enabled to control a resource.

* * * * *